United States Patent [19]

Shearer, Jr. et al.

[11] Patent Number: 4,767,985

[45] Date of Patent: Aug. 30, 1988

[54] CLAW GRIP CONTACT PROBE FOR FLAT PACKS

[75] Inventors: Joseph W. Shearer, Jr., Ellicott City; Sylvio T. Phaneuf, Annapolis, both of Md.

[73] Assignee: The United States of America as represented by the Secretary of the Air Force, Washington, D.C.

[21] Appl. No.: 131,299

[22] Filed: Dec. 8, 1987

Related U.S. Application Data

[63] Continuation-in-part of Ser. No. 779,402, Sep. 24, 1985, abandoned.

[51] Int. Cl.[4] .................. G01R 1/06; G01R 31/02
[52] U.S. Cl. .................. 324/158 P; 324/158 F
[58] Field of Search ............ 324/158 P, 158 F, 725; 269/217, 229, 234; 294/16, 100; 29/740, 741, 764, 729; 439/71, 72, 73, 219

[56] References Cited

U.S. PATENT DOCUMENTS

| | | | |
|---|---|---|---|
| 3,803,709 | 4/1974 | Beltz et al. | 324/158 P |
| 3,867,698 | 2/1975 | Beltz | 324/158 P |
| 3,896,533 | 7/1975 | Ullman et al. | 29/764 |
| 3,968,433 | 7/1976 | Dobarganes | 324/158 F |
| 4,055,800 | 10/1976 | Fisk et al. | 324/158 F |
| 4,329,642 | 5/1982 | Luthi et al. | 324/158 F |

FOREIGN PATENT DOCUMENTS 2046729 12/1977 Fed. Rep. of Germany ... 324/158 P

OTHER PUBLICATIONS

Gardner, P. A. E.; "Printed-Circuit Card Edge Connector"; IBM Tech. Dis. Bull.; vol. 15; No. 9; Feb. 1973; pp. 2963–2964.

Primary Examiner—Ernest F. Karlsen
Attorney, Agent, or Firm—Donald J. Singer; Thomas L. Kundert; Fredric L. Sinder

[57] ABSTRACT

A probe device including a unitary body 2 and a sliding plate means 44 for testing and diagnosing multi-lead electrical flat packs. The sliding plate means contains two sets of holes 52 into which are inserted spring-loaded electrical contact probes for making contact with the leads of the electrical flat pack. The unitary body 2 includes comb teeth for orienting the unitary body over the leads of the electrical flat pack, as well as gripping means having hook ends for securely fastening the probe device to the electrical flat pack being tested or diagnosed. The gripping means include an outwardly flared portion against which the sliding plate means exerts inward lateral pressure causing the hook ends to grip underneath the electrical flat pack at each corner thereof to securely clamp it in place. Included in unitary body 2 is at least one threaded hole which is sufficiently large to allow a size 4-40 machine screw to pass therethrough.

9 Claims, 3 Drawing Sheets

CLAW GRIP CONTACT PROBE FOR FLAT PACKS

RIGHTS OF THE GOVERNMENT

The invention described herein may be manufactured and used by or for the government of the United States for all governmental purposes without the payment of any royalty.

This application is a continuation-in-part of application Ser. No. 06/779,402, filed Sept. 24, 1985, now abandoned.

BACKGROUND OF THE INVENTION

1. Field of the Invention

This invention relates to a device to assist in testing and diagnosing problems in electronic integrated circuit flat packs which are soldered to a printed circuit board.

2. Description of the Prior Art

The widespread use of integrated circuit flat packs to perform various electronic functions has resulted in printed circuit boards having large numbers of these integrated circuit flat packs soldered thereon and spaced closely to each other. Consequently, whenever testing or diagnosis of malfunctions is desired, the technician has been confronted with the difficult task of using a test probe device to make contact with one particular electrical lead without touching other nearby electrical leads. Attempts to work directly on soldered leads with a single test probe have made troubleshooting on printed circuit boards densely populated by integrated circuit flat packs a difficult, time-consuming problem.

However, since the electronics industry has standardized integrated circuit flat pack dimensions and electrical lead configurations, efforts have been made to design a probe device which can be interchangeably clamped onto flat packs to provide convenient access to each electrical lead without the likelihood of inadvertent touching of a neighboring electrical lead.

The patent to Fisk et al (U.S. Pat. No. 4,055,800) discloses an important attempt to produce such a probe. This patent teaches that secure clamping of the test probe to an electronic flat pack may be achieved by using a unitary, multi-contact probe having pivotally, opposed jaws which can be placed over an electrical flat pack and mechanically secured. However, use of this test probe is a complex process involving rotating a knob on a clip until clamp elements can be manually compressed toward each other, thereby spreading the opposed jaws apart. The test probe is then placed onto an electrical flat pack, the clamp elements are released and the knob on the clip is rotated further until a cam thereon causes a lever to clamp the opposed jaws into a secure relationship with the flat pack. Moreover, since the jaws of Fisk do not include hooks, the test probe is held in place on an electrical flat pack only by lateral pressure and can be accidentally dislodged.

A number of other patents disclose attempted solutions to the problems associated with testing and diagnosing electrical flat packs, such as the U.S. patents to Luthi et al (No. 4,329,642), Dobarganes (No. 3,968,433), Beltz et al (No. 3,867,698) and Beltz et al (No. 3,803,709). However, each of these patents has failed to eliminate all of the problems solved by the invention disclosed herein. For example, the patent to Luthi et al (No. 4,329,642) does not enable testing of a flat pack which has been soldered into place, while the patent to Dobarganes (No. 3,968,433) discloses a test probe which may result in insecure fastening over a flat pack. The two patents to Beltz et al (Nos. 3,867,698 and 3,803,709) require critical manual dexterity in use and may result in precarious contact between the probe leads and the electrical leads of the flat pack.

Thus, it has remained an illusive goal in the integrated circuit flat pack test probe art to produce a test probe which is at the same time both simple to manufacture and easy to use while also resulting in a secure clamping of the probe to a flat pack.

SUMMARY OF THE INVENTION

It is the primary object of the subject invention to overcome the deficiencies of the prior art by providing a probe device for testing and diagnosing multi-lead electrical flat packs.

A further object of the invention is to provide a probe device which can be securely clamped to an electrical flat pack through hooks which grip each corner of the flat pack.

Still another object of this invention is to provide a probe device for testing and diagnosing electrical flat packs primarily comprised of a unitary body with at least one gripping means and a sliding plate for exerting lateral pressure on that gripping means to clamp the unitary body to the electrical flat pack.

Yet another object of this invention is to provide a probe device having a unitary body with four gripping means to allow the probe device to be securely clamped to a rectangular multi-lead electrical flat pack, wherein each of the gripping means has an outwardly flared portion on which inward lateral pressure can be exerted by the cooperative action of a sliding plate so as to securely clamp the probe device in place.

Still another object of this invention is to provide a probe device having a unitary body with comb teeth to assist in aligning and orienting the probe device as it is put in position over a multi-lead rectangular electrical flat pack.

Yet a further object of this invention is to provide a sliding plate for use in a probe device wherein the sliding plate is "U"-shaped having two legs and a center connecting portion with an equal number of alternately arranged holes extending through each leg and two oval cavities extending through the center connecting portion to allow the sliding plate to fit over and exert inward lateral pressure on a unitary body so as to hold that unitary body in position.

DETAILED DESCRIPTION

Figure 1:
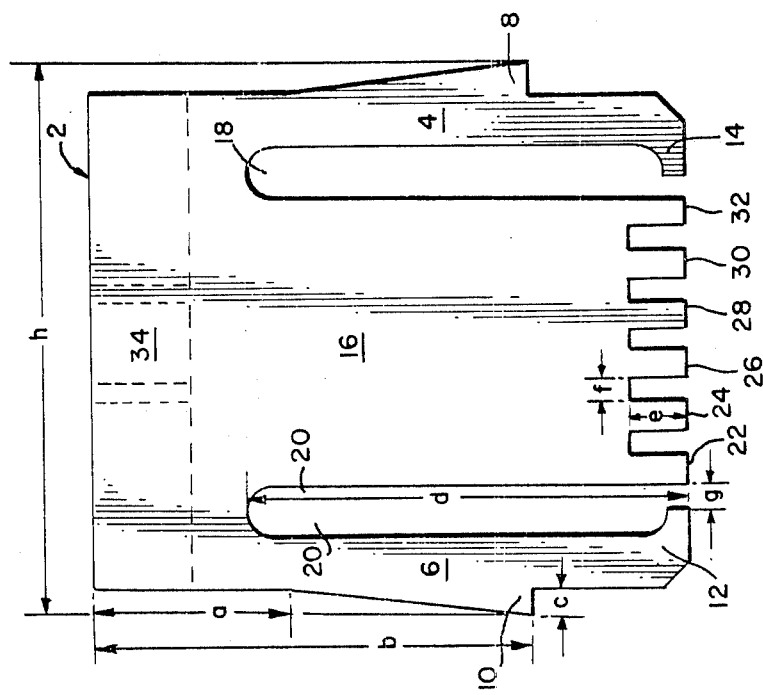
FIG. 1 is a plan side view of the unitary body forming one part of a probe device designed in accordance with this invention.

The probe device of this invention consists primarily of a unitary body 2 and a sliding plate 44 which are functionally interrelated. For a clear understanding of the structure of unitary body 2, reference is initially made to FIG. 1 which illustrates a plan side view of unitary body 2. Unitary body 2 is "U"-shaped, so that the structure shown in FIG. 1 is duplicated on the side of unitary body 2 opposite to and not visible in FIG. 1. More specifically, unitary body 2 includes four identical claw grips. Only two of these claw grips 4 and 6 are visible in FIG. 1. Each of these claw grips includes a flared portion 8 and 10 gradually extending outwardly and away from unitary body 2 starting a distance a from the top of unitary body 2 and continuing for a distance b such that each flared portion terminates a distance c away from the main portion of each claw grip. Claw grips 4 and 6 also include hook ends 12 and 14 at the bottom of unitary body 2 which, as will be described below, serve to securely clamp the probe device to an electrical flat pack. The claw grips, together with the flared portions, and hook ends, comprise the gripping means of the subject invention.

Claw grips 4 and 6 are separated from the center portion 16 of unitary body 2 by open cavities 18 and 20 which extend from the bottom of unitary body 2 a distance d. The separation of claw grips 4 and 6 from center portion 16 allows them to be flexible enough to extend outwardly to fit over the edge of the body of a flat pack which extends somewhat beyond its last electrical lead and yet, as explained below, to react to lateral pressure exerted on the respective flared portions of each claw grip to flex inwardly to securely clamp underneath the same respective flat pack body edge. Center portion 16 includes comb teeth 22, 24, 26, 28, 30 and 32. These comb teeth help to orient unitary body 2 before it is attached to the flat pack being tested, as described below. Each comb tooth extends downwardly from center portion 16 for a distance e and is separated from the next comb tooth by a distance f. These dimensions are sufficient to allow the comb teeth to fit over and between the electrical leads of a flat pack as the probe device is mounted thereon. The distance g which separates hook ends 12 and 14 from center portion 16 approximately equals the distance f so that one of the electrical leads of the electrical flat pack will also fit between each hook end and the comb tooth closest thereto.

Also included in unitary body 2 is threaded hole 34, which allows a size 4-40 machine screw (not shown in the drawings) to pass therethrough. As described below, this machine screw is used to maintain lateral pressure on the flared portions of the claw grips so that the probe device is clamped securely in place.

Unitary body 2 may be made of Lexan or Delrin or any suitably strong insulating plastic material. The actual dimensions of unitary body 2 are small, as shown in Table I, below, indicating the compact nature of the probe device.

Figure 2:
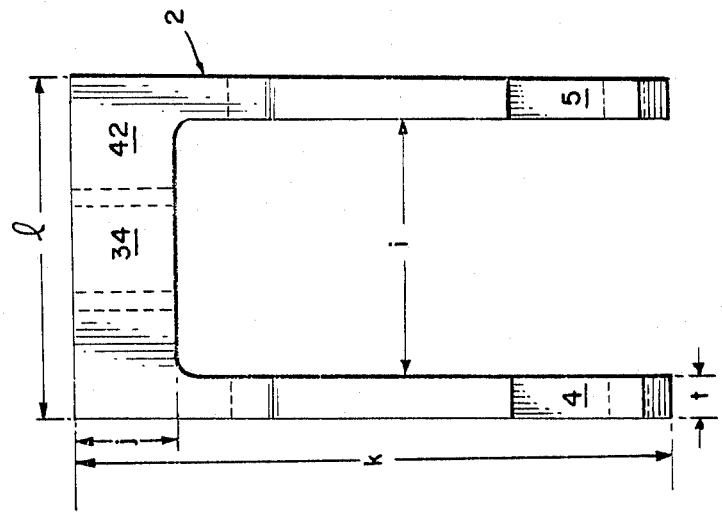
FIG. 2 is a plan end view of the unitary body of FIG. 1.

FIG. 2 illustrates a plan end view of unitary body 2 in which the essentially "U"-shaped nature of unitary body 2 is apparent. The width between the two claw grips 4 and 5 visible in FIG. 2 is a distance i which is approximately equal to the width of the electrical flat pack that the probe device is designed to test. The top portion 42 of unitary body 2 has a thickness j. The height and width of unitary body 2 are, respectively, k and l, while the maximum length of unitary body 2 is shown as h in FIG. 1. The width of the claw grip (4, 5) is t.

Figure 3:
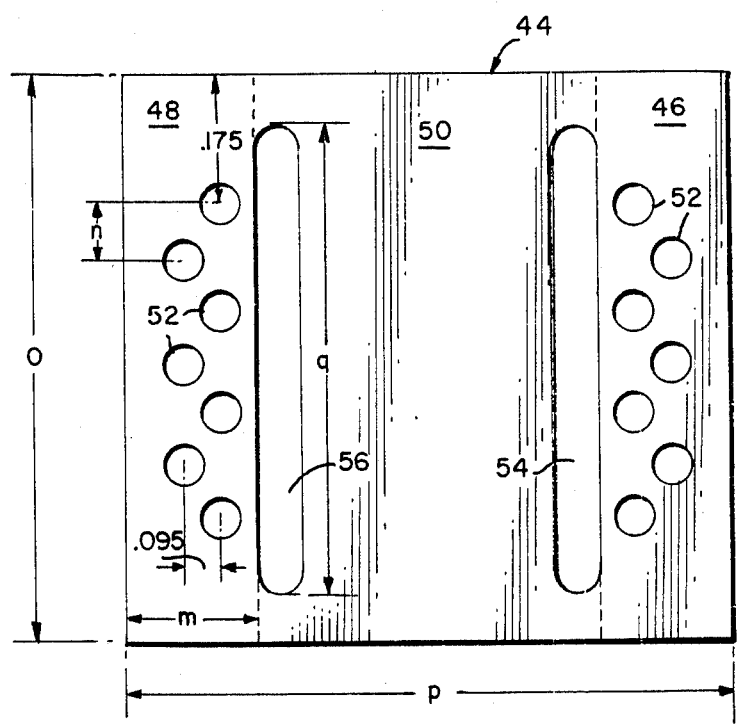
FIG. 3 is a plan overhead view of a sliding plate designed in accordance with this invention.

Reference is now made to FIG. 3 which illustrates an overhead plan view of sliding plate 44. More specifically, sliding plate 44 is "U"-shaped, including two legs 46 and 48 and a center connecting portion 50. Each leg has an identical width m and includes at least seven holes 52 extending entirely through each leg for mounting electrical probe terminals, as described below. These holes are arranged in alternating fashion along the length of each leg. Each hole has a diameter of approximately 0.037 inches and the center of each hole is vertically separated by a distance n and horizontally separated by approximately 0.095 inch from the next adjacent hole. The sliding plate 44 has a length o and a width p. The center of the last hole in each leg is spaced approximately 0.175 inch inwardly of the edge of that leg.

Center connecting portion 50 of sliding plate 44 has two cavities 54 and 56 extending entirely through center portion 50. Each cavity 54 and 56 is directly adjacent a leg, 46 and 48, respectively, and has a length q which is somewhat less than the length h of unitary body 2 so that sliding plate 44 can be mounted on unitary body 2, as described below.

Figure 4:
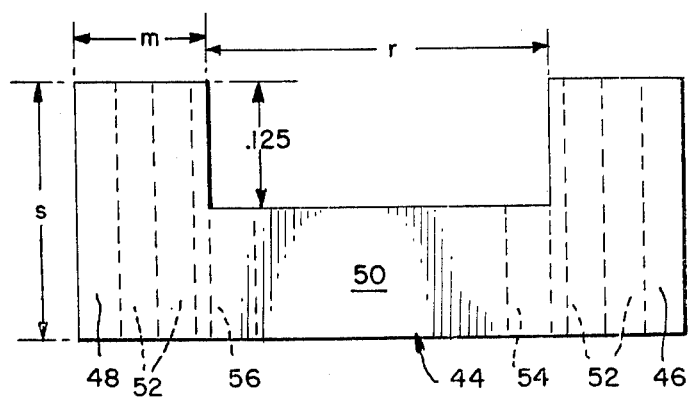
FIG. 4 is a plan end view of the sliding plate of FIG. 3.

Referring now to FIG. 4, a plan end view of sliding plate means 44 is illustrated which demonstrates the "U"-shaped structure of sliding plate 44. Center connecting portion 50 extends for a distance r between legs 46 and 48. Each leg has a height s and a width m. The depth of the "U" is 0.125 inch. FIG. 4 also illustrates the placement of holes 52 and cavities 54 and 56.

Sliding plate 44 is formed in a "U"-shape for two reasons. First, the legs must be of a certain depth to accommodate the electrical terminal connectors which are inserted therein as described below. Second, center connecting portion 50 is made to straddle the integrated circuit flat pack. Center connecting portion 50 is made substantially thinner than either of the legs, although not so thin as to adversely affect its strength. Sliding plate 44 is constructed from a strong insulating plastic material, as is unitary body 2.

Figure 5:
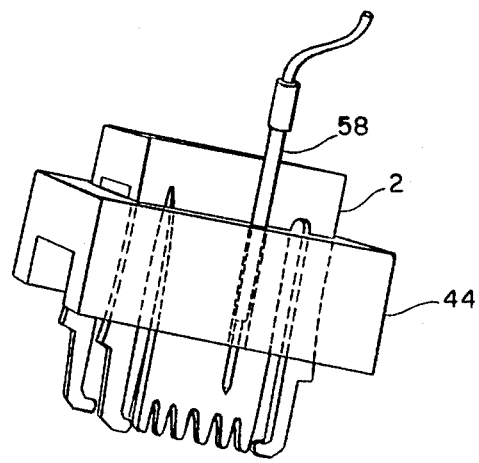
FIG. 5 is a simplified perspective view of one embodiment of an assembly of the unitary body and the sliding plate.

FIG. 5 shows sliding plate means 44 assembled to unitary body 2 to make the probe device. In order to assemble the probe device, claw grips 4 and 6, along with center portion 16 of unitary body 2 are centered over both the respective cavities 54 or 56 of sliding plate 44. Meanwhile the same centering and subsequent procedures occur on the opposed side of unitary body 2 with regard to the remaining cavity. Sliding plate 44 is then moved upwardly towards the top portion 42 of unitary body 2 until the flared portions 8 and 10 of claw grips 4 and 6 (FIG. 1) are in abutting relationship with center connecting portion 50 of sliding plate 44. By exerting inward lateral pressure on all of the flared portions of the four claw grips simultaneously, the length dimension h of unitary body 2 is temporarily reduced sufficiently to allow clearance space between each of the claw grips of unitary body 2 and the respective cavities of sliding plate 44 so that the sliding plate means can pass the flared portions and be retained in a position above the flared portions when the inward lateral tension on each of the claw grips is removed so that the length of unitary body 2 again becomes equal to h which is greater than the length q of each of the cavities in sliding plate 44. Sliding plate means 44 may be assembled to unitary body 2 either as shown in FIG. 5 or may be assembled turned over.

Spring-loaded electrical contact probes 58 (only one example of which is shown in FIG. 5) are mounted in each of the holes 52 of the legs of sliding plate 44. Installation of these contact probes may occur either before or after mounting of the sliding plate 44 on unitary body 2. Commercially available contact probes such as those manufactured by the Pylon Company, Inc., P2662A Series along with a socket 52662A may be used for the electrical contact probes.

Figure 6:
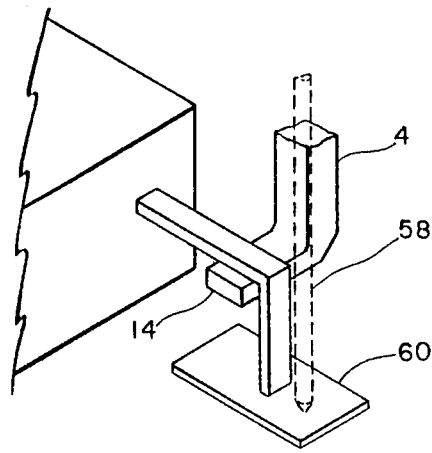
FIG. 6 is a simplified perspective view of one unitary body claw grip attached to a corner lead of an electronic or electrical flat pack.

In order to use the probe device, it is placed over a multi-lead, rectangular electrical flat pack and, through the comb teeth means in the center portion 16 of unitary body 2, the probe device is aligned and oriented over the leads of the electrical flat pack and is pushed downwardly until the hook ends of each of the claw grips are positioned beneath the respective corner leads of the electrical flat pack, as shown in FIG. 6, and the other leads thereof extend upwardly between each of the comb teeth 22-32 (FIG. 1). At this point, sliding plate 44 is pushed downwardly on unitary body 2 thereby exerting inward lateral pressure on the flared portions of each of the four claw grips moving them laterally close under the flat pack corner lead, thus anchoring the unit. The ends of contact probes 58, as shown in a dashed line representation in FIG. 6, will make electrical contact with a contact pad 60 where the lead is soldered to a printed circuit board. Due to the tendency of the claw grips to spring back into their original shape and position and as a result of the use of spring-loaded electrical contact probes, it is necessary to exert holding pressure on sliding plate 44 to keep it in position and securely fasten the probe device to the electrical flat pack. This pressure is provided by using a size 4-40 machine screw of sufficient length to pass through threaded hole 34, in the top portion 42 of unitary body 2 which is screwed down against the center connecting portion 50 of sliding plate 44.

An additional aid in aligning the electrical probe terminal directly over the respective flat pack electrical leads is a guide which is not illustrated. This guide helps to direct sliding plate 44 so that contact is made between the spring-loaded electrical contact probes and the leads of the electrical flat pack. At this point, test leads may be attached to the electrical contact probes to perform malfunction diagnoses and other tests.

Table I, which appears below, provides approximate dimensions for various critical areas in the probe device described above. However, these dimensions are given for a probe device used in testing a 14 pin electrical flat pack. It should be understood that different dimensions would be required in order to design a probe device for testing other sizes of electrical flat packs, such as those having 16 and 18 pins. Thus, while preferred features of the present invention are embodied in the structure illustrated herein, it is to be understood that changes and variations may be made by those skilled in the art without departing from the spirit and scope of the invention. For example, although this disclosure relates to rectangular flat packs, this invention can also be adapted for use with flat packs having other shapes.

TABLE I

| Dimensions from FIGS. 1 to 4 | |
|---|---|
| symbol | inches |
| a | .200 |
| b | .440 |
| c | .025 |
| d | .455 |
| e | .070 |
| f | .020 |
| g | .020 |
| h | .500 |
| i | .250 |
| j | .100 |
| k | .600 |
| l | .345 |
| m | .130 |
| n | .050 |
| o | .660 |
| p | .610 |
| q | .470 |
| r | .350 |
| s | .250 |
| t | .050 |

We claim:

1. A probe holding device for attachment to a multi-lead electrical flat pack soldered to a printed circuit board to permit testing thereof, said probe holding device comprising;
   (a) a generally rectangular unitary body having at each corner gripping means for clamping said unitary body to said electrical flat pack;
   (b) an outwardly extending flared portion defined on each of said gripping means;
   (c) sliding plate means having two oval cavities extending therethrough, each oval cavity surrounding a pair of said gripping means and free to relatively move along said gripping means for exerting lateral pressure on said flared portion of said gripping means to maintain said unitary body in a clamped relationship with said electrical flat pack; and,
   (d) contact probe holding means defined on said sliding plate means for holding a plurality of contact probes.

2. The probe holding device of claim 1, wherein said unitary body and said sliding plate means are comprised of a strong, insulating plastic material.

3. The probe holding device of claim 1, wherein each said gripping means includes a hook on one end thereof.

4. The probe holding device of claim 3, wherein each gripping means is designed to hook under a different corner lead of said multi-lead electrical flat pack.

5. The probe holding device of claim 4, wherein said unitary body includes comb teeth means for fitting over and between leads of said multi-lead electrical flat pack to align and orient said probe holding device with respect to said multi-lead electrical flat pack.

6. The probe holding device of claim 5, wherein said unitary body includes one screw means for holding said sliding plate means in position.

7. The probe holding device of claim 1, wherein said sliding plate means is a substantially "U"-shaped, rectangular body having a center connecting portion and two depending legs, said oval cavities extending through the center connecting portion.

8. The probe holding device of claim 7, wherein the contact probe holding means comprise each said leg having a plurality of holes extending therethrough.

9. The probe holding device of claim 8, wherein said holes are arranged in alternating fashion along the length of each said leg.

* * * * *